(12) United States Patent
Weiss

(10) Patent No.: US 11,935,994 B2
(45) Date of Patent: Mar. 19, 2024

(54) RADIATION EMITTING SEMICONDUCTOR CHIP, RADIATION EMITTING SEMICONDUCTOR DEVICE AND HEAD LAMP

(71) Applicant: OSRAM Opto Semiconductors GmbH, Regensburg (DE)

(72) Inventor: Guido Weiss, Pielenhofen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 414 days.

(21) Appl. No.: 17/436,081

(22) PCT Filed: Feb. 18, 2020

(86) PCT No.: PCT/EP2020/054241
§ 371 (c)(1),
(2) Date: Sep. 3, 2021

(87) PCT Pub. No.: WO2020/178021
PCT Pub. Date: Sep. 10, 2020

(65) Prior Publication Data
US 2022/0181530 A1 Jun. 9, 2022

(30) Foreign Application Priority Data
Mar. 4, 2019 (DE) ...................... 10 2019 105 402.8

(51) Int. Cl.
*H01L 33/62* (2010.01)
*H01L 33/38* (2010.01)
(Continued)

(52) U.S. Cl.
CPC ............ *H01L 33/62* (2013.01); *H01L 33/382* (2013.01); *H01L 33/405* (2013.01); *H01L 33/44* (2013.01)

(58) Field of Classification Search
CPC ..... H01L 33/62; H01L 33/382; H01L 33/405; H01L 33/44; H01L 33/486; H01L 33/38; H01L 33/08; H01L 27/156
See application file for complete search history.

(56) References Cited

U.S. PATENT DOCUMENTS

| 6,573,537 B1 | 6/2003 | Steigerwald et al. |
| 2014/0193932 A1* | 7/2014 | Lee .......................... H01L 27/15 438/29 |

(Continued)

FOREIGN PATENT DOCUMENTS

| DE | 10213701 A1 | 10/2002 |
| DE | 102012112302 A1 | 6/2014 |

(Continued)

OTHER PUBLICATIONS

International Search Report issued for the corresponding PCT patent application No. PCT/EP2020/054241, dated May 12, 2020, 4 pages (for informational purposes only).

(Continued)

*Primary Examiner* — Marc Anthony Armand
(74) *Attorney, Agent, or Firm* — Viering, Jentschura & Partner mbB

(57) ABSTRACT

A radiation emitting semiconductor chip may include a radiation emitting surface, an epitaxial semiconductor layer sequence having active regions, and a mounting surface facing the radiation emitting surface. The mounting surface may include a plurality of first and second solderable contact surfaces. Each active region may be suppliable with current with a respective first and second solderable contact surface. The first solderable contact surfaces may be arranged in an inner region of the mounting surface. The second solderable contact surface may be arranged in an edge region of the mounting surface. Furthermore, a radiation emitting semi- (Continued)

conductor device and a head lamp having such a semiconductor chip may also be useful.

17 Claims, 2 Drawing Sheets

(51) Int. Cl.
    *H01L 33/40*     (2010.01)
    *H01L 33/44*     (2010.01)

(56) References Cited

U.S. PATENT DOCUMENTS

| | | | |
|---|---|---|---|
| 2015/0270458 A1* | 9/2015 | Hoppel | H01L 33/60 257/99 |
| 2015/0325598 A1 | 11/2015 | Pfeuffer et al. | |
| 2017/0062661 A1 | 3/2017 | Otto | |
| 2019/0013351 A1 | 1/2019 | Pfeuffer | |
| 2019/0252577 A1 | 8/2019 | Scholz et al. | |
| 2020/0220056 A1 | 7/2020 | Otto et al. | |

FOREIGN PATENT DOCUMENTS

| | | |
|---|---|---|
| DE | 102014101896 A1 | 8/2015 |
| DE | 102016100351 A1 | 7/2017 |
| DE | 102016112857 A1 | 1/2018 |
| DE | 102017107201 A1 | 10/2018 |

OTHER PUBLICATIONS

German Search Report issued for the German patent application No. 10 2019 105 402.8, dated Apr. 26, 2019, 6 pages (for informational purposes only).

* cited by examiner

RADIATION EMITTING SEMICONDUCTOR CHIP, RADIATION EMITTING SEMICONDUCTOR DEVICE AND HEAD LAMP

CROSS-REFERENCE TO RELATED APPLICATIONS

The present application is a national stage entry according to 35 U.S.C. § 371 of PCT Application No. PCT/EP2020/054241 filed on Feb. 18, 2020; which claims priority to German Patent Application Serial No. 10 2019 105 402.8 filed on Mar. 4, 2019; all of which are incorporated herein by reference in their entirety and for all purposes.

TECHNICAL FIELD

A radiation emitting semiconductor chip is specified. In addition, a radiation emitting semiconductor device and a head lamp are specified.

BACKGROUND

An object to be solved is to specify a radiation emitting semiconductor chip, which is particularly compact.

Furthermore, a compact radiation emitting semiconductor device and a head lamp comprising such a semiconductor device are to be specified.

SUMMARY

According to at least one embodiment, the radiation emitting semiconductor chip comprises a radiation emitting surface comprising emitter regions separated from one another. The radiation emitting surface has a main extension plane. A lateral direction is aligned parallel to the radiation emitting surface and a vertical direction is aligned perpendicular to the lateral direction. The emitter regions are part of the radiation emitting surface and extend in the lateral direction. Furthermore, the emitter regions are arranged in a common plane.

According to one embodiment, the emitter regions are of the same type. For example, the emitter regions have the same surface area and/or the same shape.

The emitter regions are arranged spaced apart from one another in the lateral direction. The emitter regions are arranged in a matrix-like manner, i.e. along columns and rows. In a non-limiting embodiment, the emitter regions are arranged at grid points of a second regular grid. The second regular grid can be a polygonal grid, such as a hexagonal grid or an orthogonal grid.

The emitter regions each have a triangular shape, a square shape, a hexagonal shape, a circular shape, an oval shape or an elliptical shape. A maximum extent in the lateral direction of each emitter region is at least 15 micrometres and at most 50 micrometres in each case, such as between 25 micrometres and at most 35 micrometres.

According to at least one embodiment, the radiation emitting semiconductor chip comprises an epitaxial semiconductor layer sequence comprising active regions, each active region is configured to emit electromagnetic radiation from a respective emitter region.

The semiconductor layer sequence is based, for example, on an III-V compound semiconductor material. The III-V compound semiconductor material is, for example, a phosphide, arsenide and/or nitride compound semiconductor material, for example, $In_xAl_yGa_{1-x-y}P$, $In_xAl_yGa_{1-x-y}As$ and/or $In_xAl_yGa_{1-x-y}N$ with $0 \leq x \leq 1$, $0 \leq y \leq 1$ and $x+y \leq 1$.

The semiconductor layer sequence can have dopants as well as additional components. For the sake of simplicity, however, only the essential constituents of the crystal lattice of the semiconductor layer sequence, i.e. Al, Ga, In, N, As or P, are indicated, even if these can be partially replaced and/or supplemented by small amounts of further substances.

The semiconductor layer sequence comprises a first semiconductor layer of a first conductivity type and a second semiconductor layer of a second, different conductivity type. In a non-limiting embodiment, the first semiconductor layer is p-doped and thus p-conductive. In a non-limiting embodiment, the second semiconductor layer is n-doped and thus n-conductive. The first semiconductor layer and the second semiconductor layer are stacked on top of one another in the vertical direction.

In a non-limiting embodiment, the active regions are arranged between the first semiconductor layer and the second semiconductor layer. The active regions each have a pn junction for generating the electromagnetic radiation, such as a double heterostructure, a single quantum well structure or a multiple quantum well structure.

The electromagnetic radiation generated during operation of the active regions can be near-ultraviolet radiation, visible light and/or near-infrared radiation. The visible light is, for example, light of blue, green, yellow or red colour.

A conversion element can be arranged on the emitter regions, which is configured to convert electromagnetic radiation of the semiconductor chip at least partially into secondary electromagnetic radiation. In a non-limiting embodiment, the conversion element converts electromagnetic radiation of the semiconductor chip into electromagnetic secondary radiation of a different wavelength range. In a non-limiting embodiment, the secondary radiation comprises longer wavelengths than the electromagnetic radiation of the semiconductor chip. For example, if the active regions generate light of blue colour, the electromagnetic radiation emitted by the radiation emitting semiconductor chip and electromagnetic secondary radiation can mix to form white mixed light.

The active regions extend in a lateral direction and are arranged in a common plane. Further, the active regions are arranged separated from one another. In this case, the active regions are arranged spaced apart from one another in the lateral direction. In a non-limiting embodiment, the active regions are arranged in a matrix-like manner, i.e. along columns and rows. In a non-limiting embodiment, the active regions are arranged at grid points of a third regular grid. The grid points of the third grid, at which the active regions are arranged, are arranged at the same positions in plan view as the grid points of the second grid, at which the emitter regions are arranged.

The active regions each have a triangular, a square, a hexagonal, a round shape, an oval shape or an elliptical shape. A maximum extent in the lateral direction of each active region is at least 15 micrometres and at most 50 micrometres respectively, such as between 25 micrometres and at most 35 micrometres.

An emitter region is arranged above each active region in vertical direction. In a non-limiting embodiment, each active region completely overlaps with an associated emitter region in plan view. The term "associated" indicates that in each case exactly one emitter region is arranged in the vertical direction above in each case exactly one active region. Thus, for example, exactly one emitter region is assigned to each active region.

An extent in lateral direction of each active region specifies an extent in lateral direction of an assigned emitter region. It is possible that the extent in lateral direction of each active region is smaller than the extent in lateral direction of an associated emitter region. For example, a beam of electromagnetic radiation from an active region has a propagation component in the lateral direction in addition to a propagation component in the vertical direction. This allows the beam to emerge from the associated emitter region in a region that does not overlap with the active region in plan view.

According to at least one embodiment, the radiation emitting semiconductor chip comprises a mounting surface facing the radiation emitting surface, wherein the mounting surface comprises a plurality of first solderable contact surfaces and a second solderable contact surface. The mounting surface faces an outer surface of the semiconductor layer sequence opposite the radiation emitting surface. With the mounting surface, the radiation emitting semiconductor chip is suppliable with current.

The first solderable contact surfaces comprise a metal, in particular a solderable metal, or consist thereof. Furthermore, the second solderable contact surface has a further metal, in particular a further solderable metal, or consists thereof. The metal and/or the further metal is/or contains, for example, gold, silver, copper, tin, lead, bismuth and/or antimony. In a non-limiting embodiment, the metal and the further metal consist of the same materials.

The first solderable contact surfaces each have an outer surface facing away from the semiconductor layer sequence. Furthermore, the second solderable contact surface has an outer surface facing away from the semiconductor layer sequence. The outer surfaces of the first solderable contact surfaces and/or the outer surface of the second solderable contact surface are freely accessible.

The outer surfaces of the first solderable contact surfaces facing away from the semiconductor layer sequence are arranged in a common plane in the lateral direction. Furthermore, the outer surface of the second solderable contact surface facing away from the semiconductor layer sequence is arranged in a common plane with the outer surfaces of the first solderable contact surfaces. Thus, the radiation emitting semiconductor chip is surface mountable.

According to at least one embodiment, each active region is suppliable with current with a respective first solderable contact surface and the second solderable contact surface. In the region of an active region, the first semiconductor layer is electrically conductively connected to a first solderable contact surface. Furthermore, the second semiconductor layer is electrically conductively connected to the second solderable contact surface.

According to at least one embodiment, the first solderable contact surfaces are arranged in an inner region of the mounting surface. The inner region of the mounting surface does not extend in the lateral direction to an edge of the mounting surface. That is to say that an edge region of the mounting surface is free of the first solderable contact surfaces.

According to at least one embodiment, the second solderable contact surface is arranged in the edge region of the mounting surface. The edge region of the mounting surface and the inner region of the mounting surface are arranged separated from one another. Thus, the edge region of the mounting surface and the inner region of the mounting surface do not overlap in plan view. In a non-limiting embodiment, the edge region and the inner region form the mounting surface. The edge region and the inner region are directly adjacent to one another.

According to a non-limiting embodiment, the radiation emitting semiconductor chip comprises a radiation emitting surface comprising emitter regions separated from one another, an epitaxial semiconductor layer sequence comprising active regions, wherein each active region is configured to emit electromagnetic radiation from a respective emitter region. Further, in this embodiment, the radiation emitting semiconductor chip comprises a mounting surface facing the radiation emitting surface, wherein the mounting surface comprises a plurality of first solderable contact surfaces and a second solderable contact surface. Finally, in this embodiment of the radiation emitting semiconductor chip, each active region is suppliable with current with a respective one of the first solderable contact surface and the second solderable contact surface, wherein the first solderable contact surfaces are arranged in an inner region of the mounting surface, and the second solderable contact surface is arranged in an edge region of the mounting surface.

According to at least one embodiment, the inner region of the mounting surface is free of the second solderable contact surface. In a non-limiting embodiment, the first solderable contact surfaces and the second solderable contact surface do not overlap in plan view. Furthermore, the second solderable contact surface is not arranged between adjacent first solderable contact surfaces in plan view.

One idea of the radiation emitting semiconductor chip described herein is, inter alia, that the first solderable contact surfaces are arranged in an inner region of the mounting surface and the second solderable contact surface is arranged in an edge region of the mounting surface. This means that distances between directly adjacent first solderable contact surfaces in the lateral direction can advantageously be comparatively small, in particular in contrast to a conventional semiconductor chip in which the first solderable contact surfaces and the second solderable contact surface are arranged together in an inner region. Due to the small distances between directly adjacent first solderable contact surfaces, the semiconductor chip can have an increased number of active regions in contrast to the conventional semiconductor chip. Advantageously, such a radiation emitting semiconductor chip can thus be comparatively compact.

According to at least one embodiment, the first solderable contact surfaces are separated from one another by non-emitting regions. The non-emitting regions emit comparatively little or no radiation compared to the emitter regions. The non-emitting regions emit 60%, such as 80%, less radiation than the emitter regions.

The first solderable contact surfaces are spaced apart in the lateral direction. In a non-limiting embodiment, the non-emitting regions are arranged between directly adjacent first solderable contact surfaces in plan view. Further, the non-emitting regions are arranged between directly adjacent emitter regions in plan view. The non-emitting regions are further arranged between directly adjacent active regions. The non-emitting regions and the emitter regions completely fill the inner region. Furthermore, it is possible that the edge region of the mounting surface and the inner region of the mounting surface are separated from one another by non-emitting regions.

According to at least one embodiment, the second solderable contact surface completely frames the first solderable contact surfaces. In a non-limiting embodiment, the second solderable contact surface is formed continuously.

The second solderable contact surface can be arranged completely in the edge region of the mounting surface. The second solderable contact surface thus completely encloses the first solderable contact surfaces in the lateral direction.

According to at least one embodiment, the first solderable contact surfaces are arranged in a matrix-like manner, i.e. along columns and rows.

According to at least one embodiment, the first solderable contact surfaces are arranged at grid points of a first regular grid. The grid points of the first regular, grid at which the first solderable contact surfaces are arranged, are arranged at the same positions in plan view as the grid points of the second grid and/or the third grid, at which the emitter regions and/or active regions are arranged. Alternatively, it is possible that the grid points of the first regular grid are shifted in a lateral direction compared to the grid points of the second grid and/or the third grid.

The first solderable contact surfaces each have a triangular shape, a square shape, a hexagonal shape, a round shape, an oval shape or an elliptical shape.

In plan view, each emitter region and each active region completely overlaps with an associated first solderable contact surface. Further, each first solderable contact surface has a lateral dimension greater than a lateral dimension of an associated emitter region. Further, each first solderable contact surface has an extent in the lateral direction that is greater than an extent in the lateral direction of an associated active region. The term "associated" indicates that exactly one emitter region and exactly one active region are arranged in vertical direction above exactly one first solderable contact surface. Thus, for example, exactly one emitter region and exactly one active region are assigned to each of the first solderable contact surfaces.

A maximum extent in the lateral direction of each first solderable contact surface is at least 15 micrometres and at most 50 micrometres, such as between 25 micrometres and at most 35 micrometres.

According to at least one embodiment, directly adjacent first solderable contact surfaces have a distance of at least 1 micrometre to at most 20 micrometres. Preferably, directly adjacent first solderable contact surfaces have a distance of at least 5 micrometres to at most 15 micrometres.

According to at least one embodiment, the first solderable contact surfaces form at least 60% of the inner region of the mounting surface. In a non-limiting embodiment, the first solderable contact surfaces form at least 70%, more at least 80%, of the inner region of the mounting surface. That is to say that the mounting surface is formed to a large extent with the first solderable contact surfaces. Advantageously, such a semiconductor chip can dissipate heat occurring in the semiconductor layer sequence particularly well via the first solderable contact surfaces. The larger the proportion of the first solderable contact surfaces on the mounting surface, the better the heat can be dissipated.

According to at least one embodiment, each active region is electrically conductively connected to a respective first electrically conductive layer. In this case, each active region is electrically conductively connected to a respective first electrically conductive layer with a respective first solderable contact surface. In each region of the active regions, the first semiconductor layer is electrically conductively contacted with a respective first electrically conductive layer.

According to at least one embodiment, each active region is electrically conductively connected to a second electrically conductive layer. In a non-limiting embodiment, each active region is electrically conductively connected to the second electrically conductive layer with the second solderable contact surface. Furthermore, the second semiconductor layer is electrically conductively contacted with the second electrically conductive layer.

According to at least one embodiment, an electrically conductive connection layer is arranged on the second electrically conductive layer. The electrically conductive connection layer is arranged on an outer surface of the second electrically conductive layer facing away from the semiconductor layer sequence. In a non-limiting embodiment, the electrically conductive connection layer is in electrically conductive contact with the second electrically conductive layer. In a non-limiting embodiment, the electrically conductive connection layer completely covers the outer surface of the second electrically conductive layer facing away from the semiconductor layer sequence. It is possible that the electrically conductive connection layer protrudes beyond the second electrically conductive layer in the lateral direction. The first contact surfaces and the electrically conductive connection layer can overlap with one another in the lateral direction in plan view. Furthermore, the electrically conductive connection layer does not penetrate the active region in the vertical direction.

The electrically conductive connection layer is in electrically conductive contact with the second solderable contact surface, in particular in the edge region of the mounting surface. The electrically conductive connection layer is formed continuously. Furthermore, the electrically conductive connection layer completely surrounds each first electrically conductive layer. Thus, each active region is electrically conductively connected to the second electrically conductive layer and the electrically conductive connection layer to the second solderable contact surface.

According to at least one embodiment, the electrically conductive connection layer is an electrically conductive mirror layer. The electrically conductive mirror layer has a reflectivity of at least 90%, in particular 95% or 99%, for electromagnetic radiation generated in the active regions. The electrically conductive mirror layer comprises, for example, at least one of the following metals or consists thereof: silver, aluminium, rhodium, nickel, copper, gold.

If the electrically conductive mirror layer is gold, the electrically conductive mirror layer has a thickness in the vertical direction of at least 5 nanometres and at most 20 nanometres. In a non-limiting embodiment, the thickness of the electrically conductive mirror layer is between at least 7 nanometres and at most 10 nanometres.

Advantageously, a light extraction from the semiconductor chip can be increased with such an electrically conductive mirror layer.

According to at least one embodiment, a recess is arranged in the semiconductor layer sequence from a side facing the mounting surface. The non-emitting regions are defined by the recess in the semiconductor layer sequence. The recess is further formed continuously. The recess extends along grid lines of a fourth regular grid. Thus, the non-emitting regions extend along the grid lines of the fourth grid. The fourth regular grid can be a polygonal grid, such as a hexagonal grid or an orthogonal grid.

According to at least one embodiment, the recess completely penetrates the active regions. In a non-limiting embodiment, the recess completely penetrates the first semiconductor layer sequence and the active regions. In a non-limiting embodiment, the recess extends into the second semiconductor layer. In a non-limiting embodiment, the recess thus separates the active regions and segments them into separate active regions. The recess thus mediates the distance in the lateral direction of the active regions. Thus, the recess also provides the lateral extent in lateral direction of the non-emitting regions.

According to at least one embodiment, the second electrically conductive layer is arranged in the recess. The second electrically conductive layer is in direct contact with the second semiconductor layer in the region of the recess.

According to at least one embodiment, a first insulating layer is arranged between the second electrically conductive layer and a side surface of the recess. In a non-limiting embodiment, the first insulating layer is arranged completely on all side surfaces of the recess. In this case, the first insulating layer is configured to electrically insulate the second electrically conductive layer from the first semiconductor layer and the active regions.

The first insulating layer is formed electrically insulating and comprises or consists of, for example, one or more dielectric materials.

According to at least one embodiment, the first insulating layer is arranged between the electrically conductive connection layer and an outer surface of the semiconductor layer sequence facing the mounting surface. In a non-limiting embodiment, the first insulating layer is arranged between the electrically conductive connection layer and an outer surface of the first semiconductor layer facing the mounting surface. In this case, the first insulating layer is configured to insulate the second electrically conductive layer from the outer surface of the first semiconductor layer facing the mounting surface.

According to at least one embodiment, a second insulating layer is arranged on the electrically conductive connection layer on an outer surface facing the mounting surface. In a non-limiting embodiment, the second insulating layer is arranged between the first solderable contact surfaces and the electrically conductive connection layer. In a non-limiting embodiment, the second insulating layer is arranged between the first solderable contact surfaces and the electrically conductive connection layer in a form-fitting manner. In this case, the second insulating layer is configured to electrically insulate the electrically conductive connection layer from the first solderable contact surfaces.

The second insulating layer is formed electrically insulating and comprises, for example, one or more dielectric materials or consists thereof.

According to at least one embodiment, the first solderable contact surfaces are each individually and separately controllable.

A radiation emitting semiconductor device is further disclosed comprising a radiation emitting semiconductor chip described herein. All features and embodiments disclosed in connection with the radiation emitting semiconductor chip can therefore also be formed in connection with the radiation emitting semiconductor device, and vice versa.

According to at least one embodiment, the radiation emitting semiconductor device comprises a further semiconductor chip. The further semiconductor chip comprises an electronic control element. Furthermore, the further semiconductor chip can comprise a plurality of electronic control elements. For example, one electronic control element can be associated with each of the active regions. Alternatively, it is possible that several of the active regions are assigned to one electronic control element or that one electronic control element is assigned to all active regions. Furthermore, it is possible that all active regions can be controlled separately from one another by means of a single electronic control element.

According to at least one embodiment, the first solderable contact surfaces and the second solderable contact surfaces are arranged on the further semiconductor chip. The further semiconductor chip has a plurality of connection surfaces.

The first solderable contact surfaces and the second solderable contact surface can be applied directly to the connection surfaces, such as by means of a solder. The first electrically conductive contact surfaces and the second electrically conductive contact surface are in electrically conductive contact with the connection surfaces. The first solderable contact surfaces and the second electrically conductive contact surface are firmly mechanically connected to one another, such as by means of solder.

According to at least one embodiment, the further semiconductor chip comprises an integrated circuitry. The electronic control element or elements is an integrated circuitry. For example, the integrated circuitry is formed by or comprises an integrated circuit (IC). The integrated circuitry comprises, for example, a control unit, an evaluation unit and/or a drive unit. The control unit and the evaluation unit each check, for example, the state of the associated active regions. The control unit can, for example, control the state of an associated active region and, for example, switch it on or off.

Furthermore, a head lamp is specified, comprising a radiation emitting semiconductor chip described herein. All features and embodiments disclosed in connection with the head lamp are therefore also disclosed in connection with the Radiation emitting semiconductor chip, and vice versa.

According to at least one embodiment, the head lamp comprises a radiation emitting semiconductor chip.

By means of the radiation emitting semiconductor chip described herein, such a head lamp can advantageously be realised in a compact manner.

BRIEF DESCRIPTION OF THE DRAWINGS

In the following, the radiation emitting semiconductor chip described herein, the radiation emitting semiconductor device and the head lamp are explained in more detail with reference to non-limiting embodiments and the associated Figures. The drawings illustrate non-limiting embodiments and, together with the description, serve for explanation thereof. Further non-limiting embodiments and many of the intended advantages will become apparent directly from the following detailed description.

Elements that are identical, similar or have similar acting are given the same reference signs in the Figures. The Figures and the proportions of the elements shown in the Figures are not to be regarded as true to scale. Rather, individual elements can be shown exaggeratedly large for better representability and/or for better comprehensibility.

DETAILED DESCRIPTION

Figure 1:
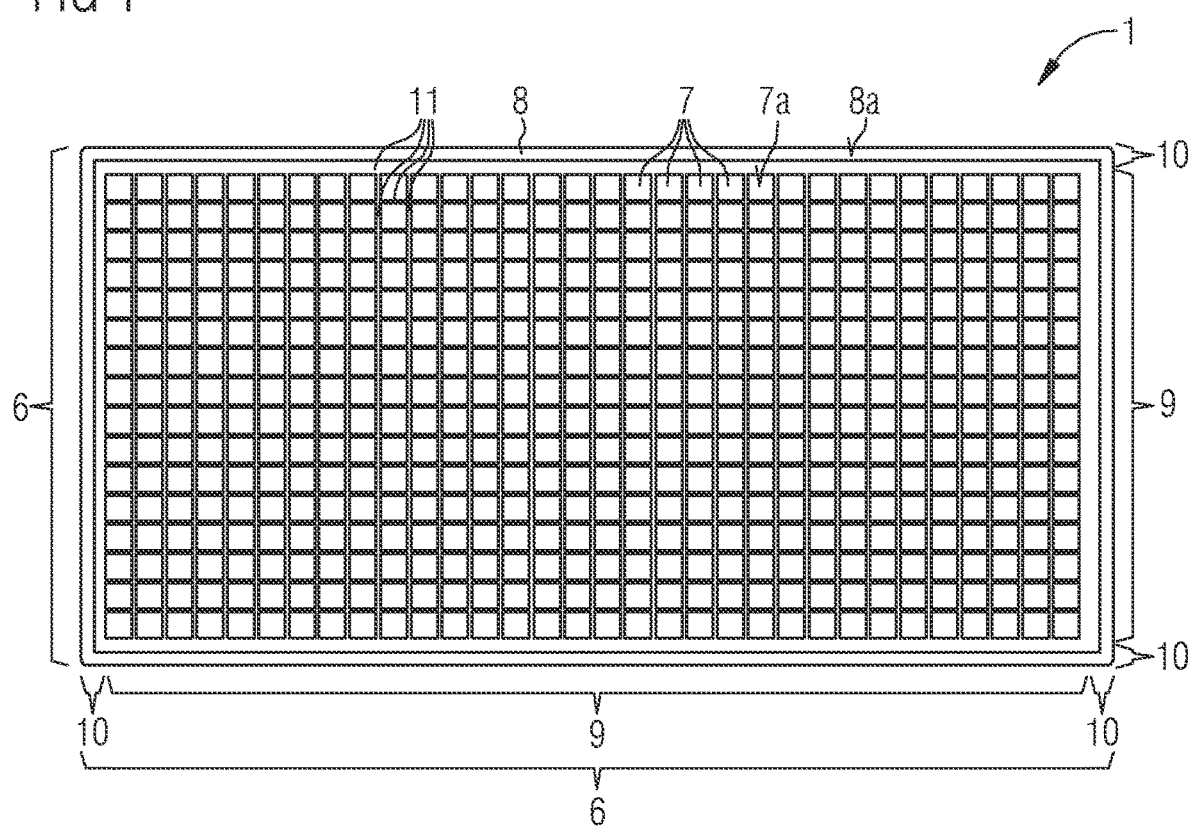
FIG. 1 schematic top view of a radiation emitting semiconductor chip according to an exemplary embodiment, FIG. 2 schematic representations of a section of FIG. 1, FIG. 3 schematic sectional views of a radiation emitting semiconductor chip according to an embodiment, and FIG. 4 schematic sectional views of a radiation emitting semiconductor device according to a further embodiment.
Figure 2:
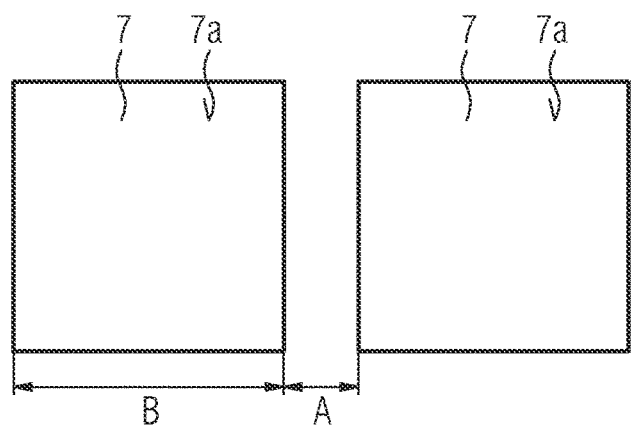

The radiation emitting semiconductor chip according to the exemplary embodiment of FIGS. 1 and 2 has a mounting surface 6. The mounting surface 6 faces a radiation emitting surface 2 (not shown here). The radiation emitting semiconductor chip 1 is suppliable with current via the mounting surface 6.

The mounting surface 6 comprises a plurality of first solderable contact surfaces 7 and a second solderable contact surface 8. The first solderable contact surfaces 7 are arranged in a matrix-like manner, that is, along columns and rows. In this exemplary embodiment, the first solderable contact surfaces 7 are arranged at grid points of a first regular grid. The first regular grid is here an orthogonal grid, more precisely a square grid. The first solderable contact surfaces 7 each have a square, in particular rectangular, shape.

The first solderable contact surfaces 7 are arranged spaced apart from one another in the lateral direction. Furthermore, the first solderable contact surfaces 7 are separated from one another by non-emitting regions 11. The non-emitting regions 11 are arranged between directly adjacent first solderable contact surfaces 7 in plan view. The non-emitting regions 11 form a fourth regular grid, the non-emitting regions extending along grid lines of the fourth grid. The fourth regular grid is here a square grid.

The first solderable contact surfaces 7 are arranged completely in an inner region of the mounting surface 9.

Furthermore, an edge region of the mounting surface 10 is free of the first solderable contact surfaces 7. The second solderable contact surface 8 is arranged in the edge region of the mounting surface 10. The edge region of the mounting surface 10 and the inner region of the mounting surface 9 are arranged separately from one another and do not overlap with one another in plan view. The edge region of the mounting surface 10 and the inner region of the mounting surface 9 are separated from one another by non-emitting regions 11.

The second solderable contact surface 8 completely frames the first solderable contact surfaces 7. In this exemplary embodiment, the second solderable contact surface 8 is formed continuously. The second solderable contact surface 8 thus completely surrounds the first solderable contact surfaces 7 in the lateral direction.

An outer surface of the second solderable contact surface 8a facing away from the semiconductor layer sequence 4 is arranged in a common plane with the outer surfaces 7a of the first solderable contact surfaces 7 facing away from the semiconductor layer sequence 4. Thus, the radiation emitting semiconductor chip 1 is surface mountable.

As the section of the inner region of the mounting surface 9 according to FIG. 2 shows, a first solderable contact surface 7 has a lateral extent B in the lateral direction. The extent B of the first solderable contact surfaces is at least 15 micrometres and at most 50 micrometres, such as between 25 micrometres and at most 35 micrometres.

Two directly adjacent first solderable contact surfaces 7 have a distance B from one another. The distance B here is between at least 1 micrometre and at most 20 micrometres, such as between at least 5 micrometres and at most 15 micrometres.

With such distances A and extents B in lateral direction, the first solderable contact surfaces 7 can form at least 60% of the inner region of the mounting surface 9, such as, the first solderable contact surfaces 7 form at least 70%, such as at least 80%, of the inner region of the mounting surface 9. In this exemplary embodiment, the mounting surface 9 is formed to a large extent with the first solderable contact surfaces 7.

Figure 3:
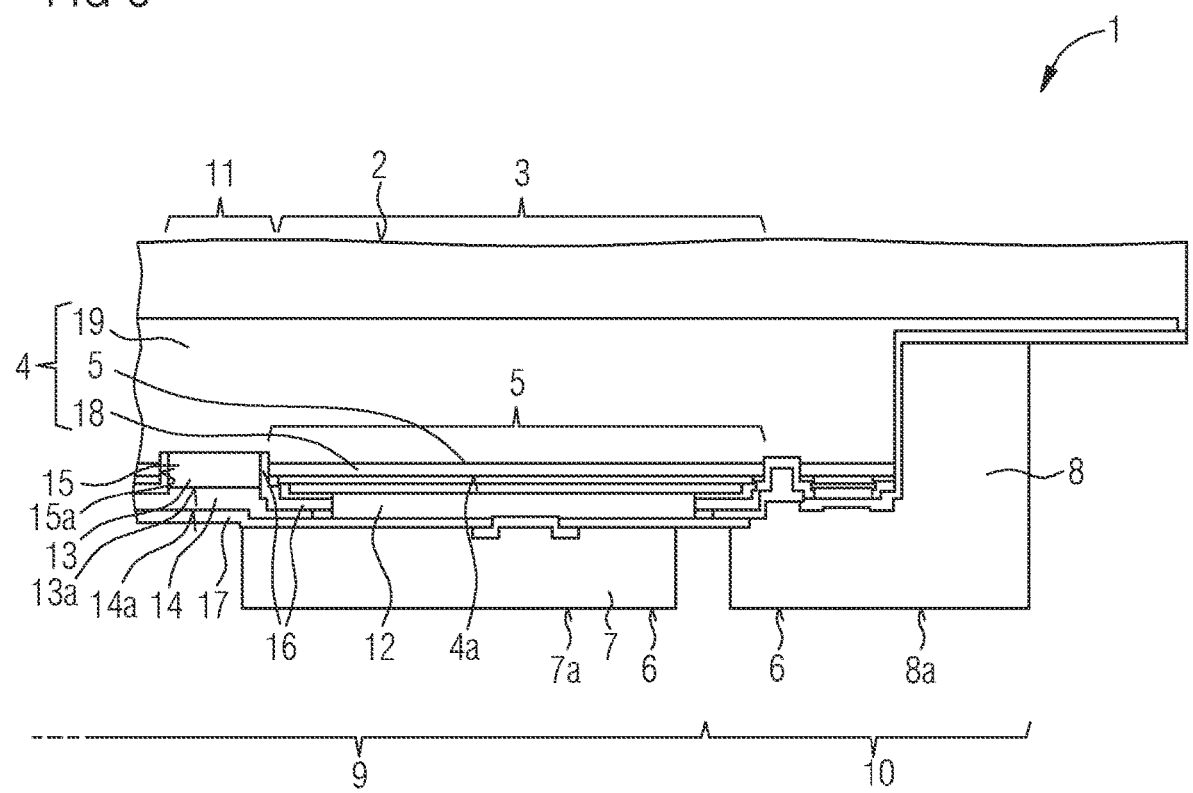

The radiation emitting semiconductor chip 1 according to the exemplary embodiment of FIG. 3 has an epitaxial semiconductor layer sequence 4 comprising active regions 5. Each of the active regions 5 is configured to emit electromagnetic radiation from a respective emitter region 3.

The semiconductor layer sequence 4 comprises a first semiconductor layer 18 of a first conductivity type and a second semiconductor layer 19 of a second, different conductivity type. In this exemplary embodiment, the first semiconductor layer 18 is p-doped and thus p-conductive, and the second semiconductor layer 19 is n-doped and thus n-conductive in this exemplary embodiment. Furthermore, the active regions 5 are arranged between the first semiconductor layer 18 and the second semiconductor layer 19.

A recess 15 is arranged in the semiconductor layer sequence 4 from a side facing the mounting surface 9. The recess 15 completely penetrates the first semiconductor layer sequence 18 and the active regions 5. Furthermore, the recess 15 extends into the second semiconductor layer 19. Thus, the recess 15 separates the active regions 5 and segments them into active regions 5 separated from one another. The recess 15 thus imparts a distance of the active regions 5 in lateral direction. The recess thus determines the extent in the lateral direction of the emitter regions 5. An emitter region 3 is arranged above an associated active region 5. The active region 5 overlaps completely with the associated emitter region 3 in plan view.

The non-emitting regions 11 are predetermined by the recess 15. The recess 15 is formed continuously and extends along grid lines of a fourth regular grid.

Furthermore, a second electrically conductive layer 13 is arranged in the recess 15. The second electrically conductive layer 13 is in direct contact with the second semiconductor layer 19 in the region of the recess 15. A first insulating layer 16 is arranged between the second electrically conductive layer 13 and a side surface of the recess 15a. The first insulating layer 15 is configured to electrically insulate the second electrically conductive layer 13 from the first semiconductor layer 18 and the active regions 5.

An electrically conductive connection layer 14 is arranged on the second electrically conductive layer 13. In this case, the electrically conductive connection layer 14 is arranged directly on an outer surface of the second electrically conductive layer 13a facing away from the semiconductor layer sequence 4. The electrically conductive connection layer 14 protrudes beyond the second electrically conductive layer 13 in the lateral direction.

It is possible that the electrically conductive connection layer 14 is an electrically conductive mirror layer, which is reflective for electromagnetic radiation generated in the active regions 5 and comprises gold.

The electrically conductive connection layer 14 is in electrically conductive contact with the second contact surface 8 in the edge region of the mounting surface 10. The second semiconductor layer 19 is electrically conductively connected to the second contact surface 8 via the electrically conductive connection layer 14 and the second electrically conductive layer 13.

Furthermore, each active region 5 is electrically conductively connected to a respective first electrically conductive layer 12 with a respective first solderable contact surface 7. In the region of the active region 5, the first semiconductor layer 18 is in electrically conductive contact with the first electrically conductive layer 12.

The first insulating layer 16 is further arranged between the electrically conductive connection layer 14 and an outer surface of the semiconductor layer sequence 4a facing the mounting surface 6.

Furthermore, a second insulating layer 17 is arranged on the electrically conductive connection layer 14 on an outer surface 14a facing the mounting surface 6. Here, the second insulating layer 17 is arranged between the first solderable contact surfaces 7 and the electrically conductive connection layer 14 in a form-fit manner.

Figure 4:
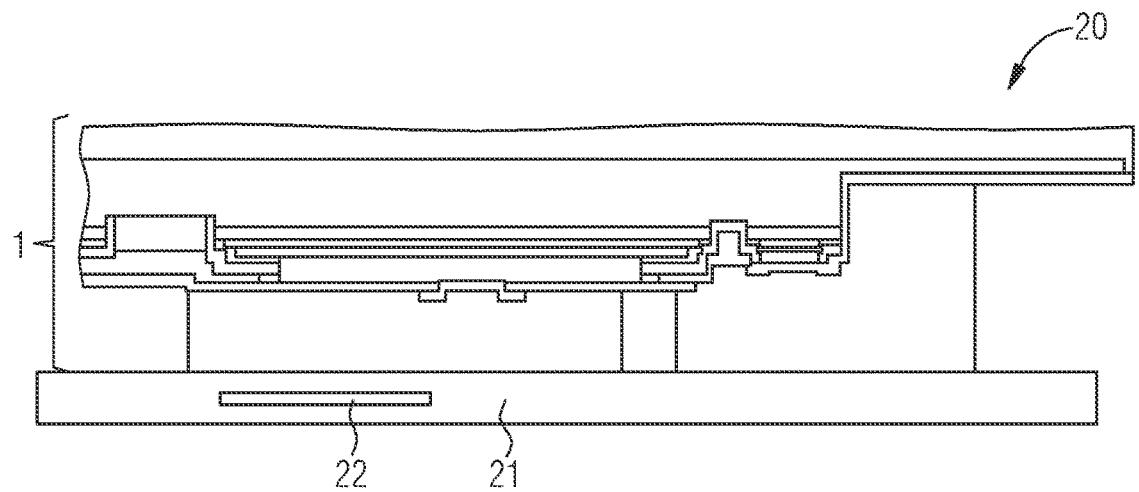

The radiation emitting semiconductor device 20 according to the exemplary embodiment of FIG. 4 has a radiation emitting semiconductor chip 1 according to FIG. 3.

The radiation emitting semiconductor device further comprises a further semiconductor chip 21. The further semiconductor chip 21 here has an electronic control element, which is an integrated circuitry 22. By means of the integrated circuitry 22, inter alia, a state of one, some or all of the active regions 5 can be controlled.

The radiation emitting semiconductor chip 1 is arranged with its first solderable contact surfaces 7 and the second solderable contact surfaces 7 on the further semiconductor chip 20.

The radiation emitting semiconductor chip 1 shown in FIG. 3 or the radiation emitting semiconductor device 20 shown in FIG. 4 can be incorporated in a head lamp.

This patent application claims priority to the German patent application 10 2019 105 402.8, the disclosure content of which is hereby incorporated by reference.

The invention is not limited to the exemplary embodiments by the description based thereon. Rather, the invention encompasses any new feature as well as any combination of features, which in particular includes any combination of features in the claims, even if this feature or combination itself is not explicitly indicated in the claims or exemplary embodiments.

LIST OF REFERENCE SIGNS 1 radiation emitting semiconductor chip
2 radiation emitting surface
3 emitter region
4 semiconductor layer sequence
4a outer surface of the semiconductor layer sequence
5 active region
6 mounting surface
7 first solderable contact surface
7a outer surface of first solderable contact surface
8 second solderable contact surface
8a outer surface of second solderable contact surface
9 inner region of mounting surface
10 edge region of the mounting surface
11 non-emitting regions
12 first electrically conductive layer
13 second electrically conductive layer
13a outer surface of second electrically conductive layer
14 electrically conductive connection layer
14a outer surface of electrically conductive connection layer
15 recess
15a side surface of recess
16 first insulating layer
17 second insulating layer
18 first semiconductor layer
19 second semiconductor layer
20 radiation emitting semiconductor device
21 further semiconductor chip
22 integrated circuitry
A distance

The invention claimed is:

1. A radiation emitting semiconductor chip comprising:
a radiation emitting surface comprising emitter regions separated from one another;
an epitaxial semiconductor layer sequence comprising active regions, wherein each active region is configured to emit electromagnetic radiation from a respective emitter region; and
a mounting surface facing the radiation emitting surface, wherein the mounting surface comprises a plurality of first solderable contact surfaces and a second solderable contact surface;
wherein:
each active region is suppliable with current with a respective first solderable contact surface and the second solderable contact surface;
the first solderable contact surfaces are arranged in an inner region of the mounting surface;
the second solderable contact surface is arranged in an edge region of the mounting surface;
a recess is arranged in the semiconductor layer sequence from a side facing the mounting surface;
the recess completely penetrates the active regions;
a second electrically conductive layer is arranged in the recess;
an electrically conductive connection layer is arranged on the second electrically conductive layer;
an electrically conductive connection layer is arranged on the semiconductor layer sequence;
the electrically conductive connection layer is electrically conductively connected to the second solderable contact surface; and
the electrically conductive connection layer is at least 5 nanometres and at most 20 nanometres thick.

2. The radiation emitting semiconductor chip according to claim 1,
wherein the inner region of the mounting surface is free of the second solderable contact surface.

3. The radiation emitting semiconductor chip according to claim 1,
wherein the first solderable contact surfaces are separated from one another by non-emitting regions.

4. The radiation emitting semiconductor chip according to claim 1,
wherein the second solderable contact surface completely frames the first solderable contact surfaces.

5. The radiation emitting semiconductor chip according to claim 1,
wherein the first solderable contact surfaces are arranged along columns and rows.

6. The radiation emitting semiconductor chip according to claim 1,
wherein the first solderable contact surfaces are arranged at grid points of a first regular grid.

7. The radiation emitting semiconductor chip according to claim 1,
wherein directly adjacent first solderable contact surfaces have a distance of at least 1 micrometre to at most 20 micrometres.

8. The radiation emitting semiconductor chip according to claim 1,
wherein the first solderable contact surfaces have a maximum extent in the lateral direction of at least 10 micrometres to at most 50 micrometres.

9. The radiation emitting semiconductor chip according to claim 1,
wherein the first solderable contact surfaces form at least 60% of the inner region of the mounting surface.

10. The radiation emitting semiconductor chip according to claim 1, wherein:
each active region is electrically conductively connected to a respective first electrically conductive layer; and
each active region is electrically conductively connected to a second electrically conductive layer.

11. The radiation emitting semiconductor chip according to claim 1,
wherein the electrically conductive connection layer is an electrically conductive mirror layer.

12. The radiation emitting semiconductor chip according to claim 1,
wherein a first insulating layer is arranged between the second electrically conductive layer and a side surface of the recess.

13. The radiation emitting semiconductor chip according to claim 12,
wherein the first insulating layer is arranged between the electrically conductive connection layer and an outer surface of the semiconductor layer sequence facing the mounting surface.

14. The radiation emitting semiconductor chip according to claim 1,
wherein a second insulating layer is arranged on the electrically conductive connection layer on an outer surface facing the mounting surface.

15. The radiation emitting semiconductor chip according to claim 1,
wherein the first solderable contact surfaces are each individually and separately drivable.

16. The radiation emitting semiconductor device comprising a semiconductor chip according to claim 1, comprising a further semiconductor chip, wherein:
the first solderable contact surfaces and the second solderable contact surface are arranged on the further semiconductor chip; and
the further semiconductor chip comprises an integrated circuitry.

17. Head A head lamp comprising:
a radiation emitting semiconductor chip according to claim 1.

* * * * *